(12) United States Patent
Ziemkus

(10) Patent No.: US 9,836,682 B2
(45) Date of Patent: Dec. 5, 2017

(54) SYSTEM AND METHOD FOR DETECTING THE DEPTH OF AN ANTENNA IN THE CARD BODY OF A SMART CARD

(71) Applicant: American Banknote Corporation, Fort Lee, NJ (US)

(72) Inventor: Thomas Ziemkus, Harleysville, PA (US)

(73) Assignee: AMERICAN BANKNOTE CORPORATION, Fort Lee, NJ (US)

( * ) Notice: Subject to any disclaimer, the term of this patent is extended or adjusted under 35 U.S.C. 154(b) by 241 days.

(21) Appl. No.: 14/680,358

(22) Filed: Apr. 7, 2015

(65) Prior Publication Data

US 2015/0286916 A1    Oct. 8, 2015

Related U.S. Application Data

(60) Provisional application No. 61/976,123, filed on Apr. 7, 2014.

(51) Int. Cl.
*G01V 3/18* (2006.01)
*G06K 19/06* (2006.01)
(Continued)

(52) U.S. Cl.
CPC ......... *G06K 19/0722* (2013.01); *G01R 29/10* (2013.01); *G06K 19/07754* (2013.01)

(58) Field of Classification Search
CPC ......... G06K 19/0722; G06K 19/07754; G01R 29/10
(Continued)

(56) References Cited

U.S. PATENT DOCUMENTS 5,786,696 A * 7/1998 Weaver .................... G01V 3/15
324/233
6,174,113 B1    1/2001 Brechignac et al.
(Continued)

FOREIGN PATENT DOCUMENTS

CN          104001976 A     8/2014

OTHER PUBLICATIONS

Agilent Technologies, "Using a Network and Impedance Analyzer to Evaluate 13.56 MHz RFID Tags and Readers/Writers," Feb. 8, 2012; Retrieved from Internet: http://www.eetindia.co.in/STATIC/PDF/201204/EEIOL_2012APR27_NET_TEST_RFD_AN_01.pdf?SOURCES=DOWNLOAD; p. 5, paragraphs 1, 3, figure 7.

*Primary Examiner* — Farhana Hoque
(74) *Attorney, Agent, or Firm* — Kriegsman & Kriegsman

(57) ABSTRACT

A system for detecting the depth of an antenna embedded in the card body of a smart card includes a milling device for forming a cavity in the card body, a test device disposed in close proximity to the card body, a vector network analyzer (VNA) for measuring a linear characteristic of the test device, and a control device for regulating operation of the milling device in view of data collected by the VNA. In use, the VNA generates a test signal and measures the degree of signal reflection from the test device. Under normal conditions, the VNA observes a spike in forward return loss at the natural resonant frequency of the open antenna circuit. However, at the instant that the milling device contacts the antenna, a notable variance in the degree of signal reflection is observed which indicates that the proper antenna depth has been reached.

3 Claims, 6 Drawing Sheets

(51) Int. Cl.
*G06K 19/07* (2006.01)
*G01R 29/10* (2006.01)
*G06K 19/077* (2006.01)

(58) Field of Classification Search
 USPC .................................. 324/329, 626; 235/492
 See application file for complete search history.

(56) References Cited

U.S. PATENT DOCUMENTS

| | | |
|---|---|---|
| 6,867,981 B2 | 3/2005 | Murohara |
| 6,881,605 B2 | 4/2005 | Lee et al. |
| 8,640,965 B2 | 2/2014 | Sutera |
| 2012/0193436 A1* | 8/2012 | Sutera .............. G06K 19/07769 |
| | | 235/492 |

* cited by examiner

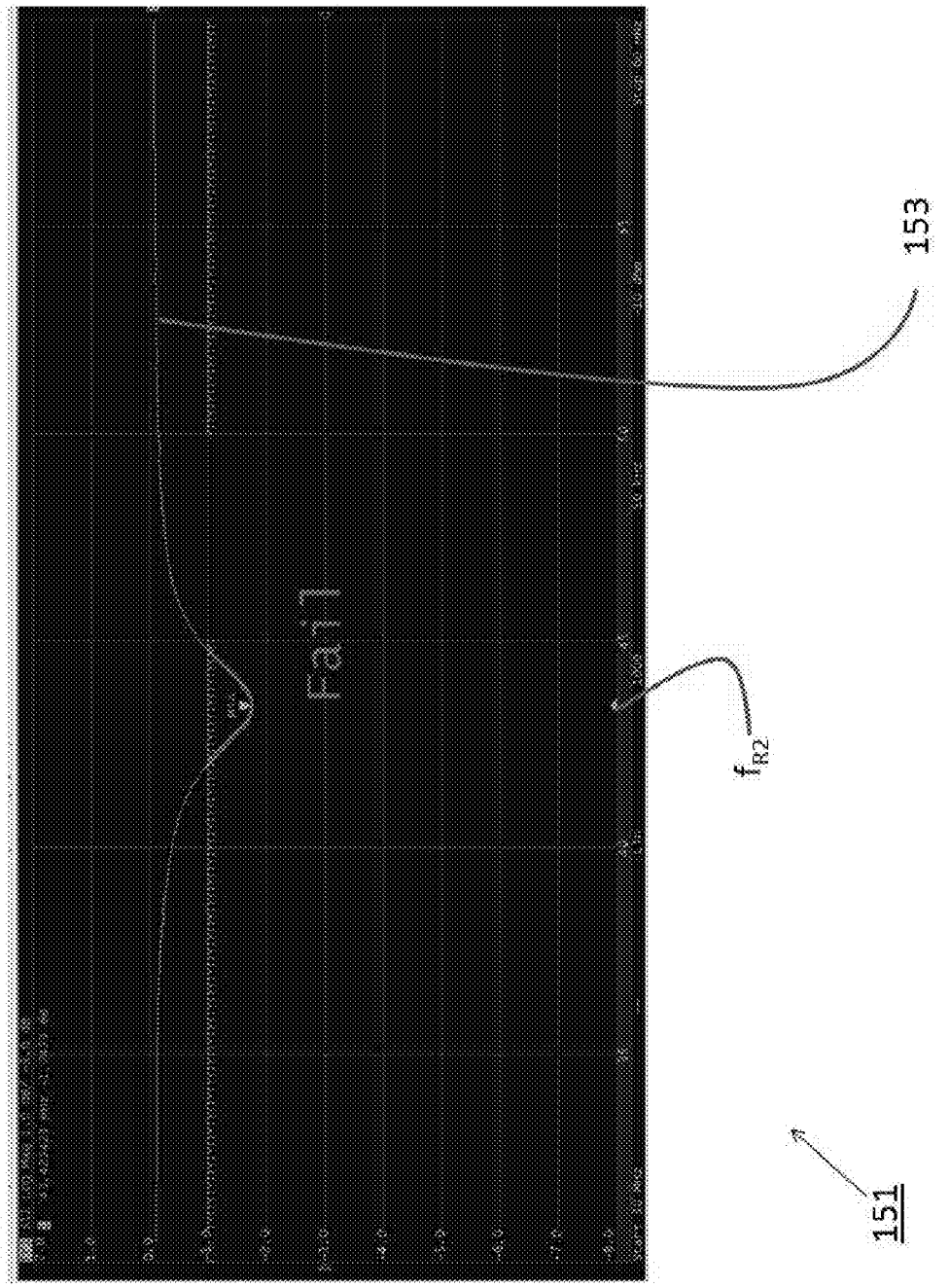

SYSTEM AND METHOD FOR DETECTING THE DEPTH OF AN ANTENNA IN THE CARD BODY OF A SMART CARD

FIELD OF THE INVENTION

The present invention relates generally to smart cards and, more particularly, to systems and methods for manufacturing smart cards that include an antenna.

BACKGROUND OF THE INVENTION

Smart cards are well known devices that include a card body into which is embedded an integrated circuit (IC). The integrated circuit is designed to store data that can be used, inter alia, to provide the card with electronic identification, authentication, data storage and application processing capabilities. As a result, smart cards, which are also commonly referred to as integrated circuit cards or chip cards, are widely used in commerce to provide information and/or application processing capabilities in connection with, but not limited to, bank cards, credit cards, health insurance cards, driver's licenses, transportation cards, loyalty cards and membership cards.

Smart cards of the type as described above transmit data stored on the integrated circuit using either (i) a direct contact interface (the resultant products being commonly referred to in the art as contact smart cards), (ii) a contact-free interface (the resultant products being commonly referred to in the art as contactless smart cards) or (ii) a hybrid of the two aforementioned interfaces (the resultant products being commonly referred to in the art as dual-interface smart cards).

Contactless and dual-interface smart cards typically utilize an antenna embedded in the card body as a non-contact means for transmitting communication signals between the integrated circuit and an associated card reader. The antenna is commonly constructed as a conductive wire that is arranged in a coiled, or spiraled, configuration within the card body. Each free end of the wire is often arranged into a dense configuration, such as a tightly wrapped coil, spiral, W-shape, or zig-zag formation, to form a suitable contact terminal.

To achieve functionality of the smart card, the integrated circuit needs to be coupled to the antenna. Traditionally, the integrated circuit is connected to the antenna through either direct connection or inductive coupling.

To facilitate its handling and connection, an integrated circuit designed for use in a smart card is traditionally mounted on a lead frame to form a unitary IC module. As part of its construction, an IC module typically includes contact pads on the underside of the lead frame, with each contact pad serving as a suitable connection surface.

Accordingly, direct connection relies upon connecting a conductive element (e.g. a wire, conductive epoxy or combination thereof) between the contact pads on the IC module and the contact terminals for the antenna. However, in order to directly connect the contact pads on the IC module to the contact terminals of the antenna, a cavity is typically milled in the card body to a depth that is sufficient to at least partially expose the antenna contact terminals.

With the contact terminals for the antenna exposed, direct connection is commonly made between the antenna and the IC module using a variety of different connection techniques.

As an example, in U.S. Pat. No. 8,640,965 to C. M. Sutera, the disclosure of which is incorporated herein by reference, there is shown a dual-interface smart card that electrically connects an IC module to exposed sections of an antenna using a pair of opposing, stapled-shaped, conductive elements, with one conductive element being permanently welded to a contact pad on the IC module and the other conductive element being permanently welded to the antenna. Each conductive element includes a pair of resilient spring arms that maintain electrical connection between the contact pad and the antenna even upon movement of the IC module relative to the card body. To provide further redundancy of connection between each contact pad and the antenna, the resilient spring arms of the opposing conductive elements are encapsulated with a supply of conductive filler material.

As another example, in U.S. Pat. No. 6,881,605 to C. K. Lee, the disclosure of which is incorporated herein by reference, there is disclosed a method of forming a dual-interface smart card that establishes connection between an IC and an antenna coil by pulling out the two free ends of the antenna coil from the core sheet, and securing each of the extracted free ends of the antenna to the integrated circuit, for example, by soldering or thermocompression bonding.

As referenced briefly above, direct connection of the IC module to the antenna first requires that a cavity be milled into one surface of the card body to expose the antenna contact terminals. As a critical aspect of the milling process, the cavity must be precisely milled to the proper depth. If the cavity is not milled to the requisite depth, the antenna contact terminals would not be adequately exposed for direct connection. By contrast, if the cavity is milled beyond the requisite depth, the antenna contact terminals may become damaged and therefore compromise the overall operability of the smart card.

However, it has been found that milling a cavity into the card body to the proper depth is often rendered challenging due to natural variances in card thickness resulting from, inter alia, material thickness tolerances of individual layers in the card body as well as process tolerances during lamination of the card body. As a result of these variances in card thickness, the antenna contact terminals of a smart card are not always located at the same depth relative to a card surface.

Accordingly, methods for determining proper antenna depth in a card body are required. Currently, various techniques exist for milling the cavity to the proper depth to allow for subsequent connection of the antenna to the IC module.

In one well-known technique, milling is performed in an incremental fashion, with the milling tool being withdrawn from the card after each step (i.e. increase in depth) to visually inspect whether the antenna contact terminals have been adequately exposed.

In another well-known technique, a pair of pilot holes, each of limited cross-sectional diameter, is simultaneously milled into the card body in alignment with the antenna contact terminals. Once both of the milling bits used to create the pilot holes contact the antenna, there is a measurable change in conductivity between the milling bits, which indicates proper milling depth. With the depth of the milling tool locked relative to the card (i.e. in the Z direction), formation of the cavity in the desired geometry is achieved by replacing each milling bit and/or moving the milling tool relative to the card body within the locked plane.

In another well-known technique, which is shown in U.S. Pat. No. 6,174,113 to R. Brechignac et al., the disclosure of which is incorporated herein by reference, an electric potential is generated in the antenna. Once the milling tool contacts the antenna, there is a measurable change in the electric potential of the milling tool, which indicates proper milling depth. With the depth of the milling tool locked relative to the card (i.e. in the Z direction), formation of the entire cavity in the desired geometry can be achieved.

Although well known in the art, the aforementioned milling techniques have been found to suffer from certain shortcomings. In particular, the incremental milling technique has been found to be both time-consuming and labor-intensive in nature, the pilot-type milling technique has been found to suffer from a lack of precision due to machine tolerances (since the contact surfaces of the milling bits need to be acutely adjusted to lie in the same plane) and the electric potential-type milling technique has been found to suffer from a lack of precision due to interference from unanticipated electromagnetic fields present in the immediate environment.

SUMMARY OF THE INVENTION

It is an object of the present invention to provide a new and improved system and method for detecting the depth of an antenna in the card body of a smart card.

It is another object of the present invention to provide a system and method as described above that compensates for variances in the thickness of the card body.

It is yet another object of the present invention to provide a system and method as described above that detects the depth of the antenna in the card body in a simple, efficient, and precise manner.

It is still another object of the present invention to provide a system and method as described above that detects the depth of the antenna in the card body without interference from conditions present in the immediate environment.

Accordingly, as one feature of the present invention, there is provided a system for detecting the depth of an antenna embedded in a card body, the antenna having a resonant frequency, the system comprising (a) a milling device for forming a cavity in the card body, (b) a test device disposed in relation to the card body, (c) a network analyzer for measuring a linear characteristic of the test device, and (d) a control device electrically connected to the milling device and the network analyzer, wherein the control device regulates operation of the milling device in view of the linear characteristic measured by the network analyzer.

As another feature of the present invention, there is provided a method for detecting the depth of an antenna embedded in a card body, the antenna having a resonant frequency, the method comprising the steps of (a) disposing a test device proximate to the card body, (b) milling a cavity into the card body to a first predefined depth using a milling device, (c) measuring a linear characteristic of the test device using a network analyzer, the network analyzer being in electrical connection with the test device, and (d) regulating operation of the milling device in view of the linear characteristic measured by the network analyzer using a control device, the control device being electrically connected to the milling device and the network analyzer.

Various other features and advantages will appear from the description to follow. In the description, reference is made to the accompanying drawings which form a part thereof, and in which is shown by way of illustration, various embodiments for practicing the invention. The embodiments will be described in sufficient detail to enable those skilled in the art to practice the invention, and it is to be understood that other embodiments may be utilized and that structural changes may be made without departing from the scope of the invention. The following detailed description is therefore, not to be taken in a limiting sense, and the scope of the present invention is best defined by the appended claims.

BRIEF DESCRIPTION OF THE DRAWINGS

In the drawings, wherein like reference numerals represent like parts:

FIGS. 3(a)-(c) are a series of graphical representations that are useful in understanding how the system of FIG. 1 can be used to detect antenna depth.

DETAILED DESCRIPTION OF THE INVENTION

Antenna Detection System 11

Figure 1:
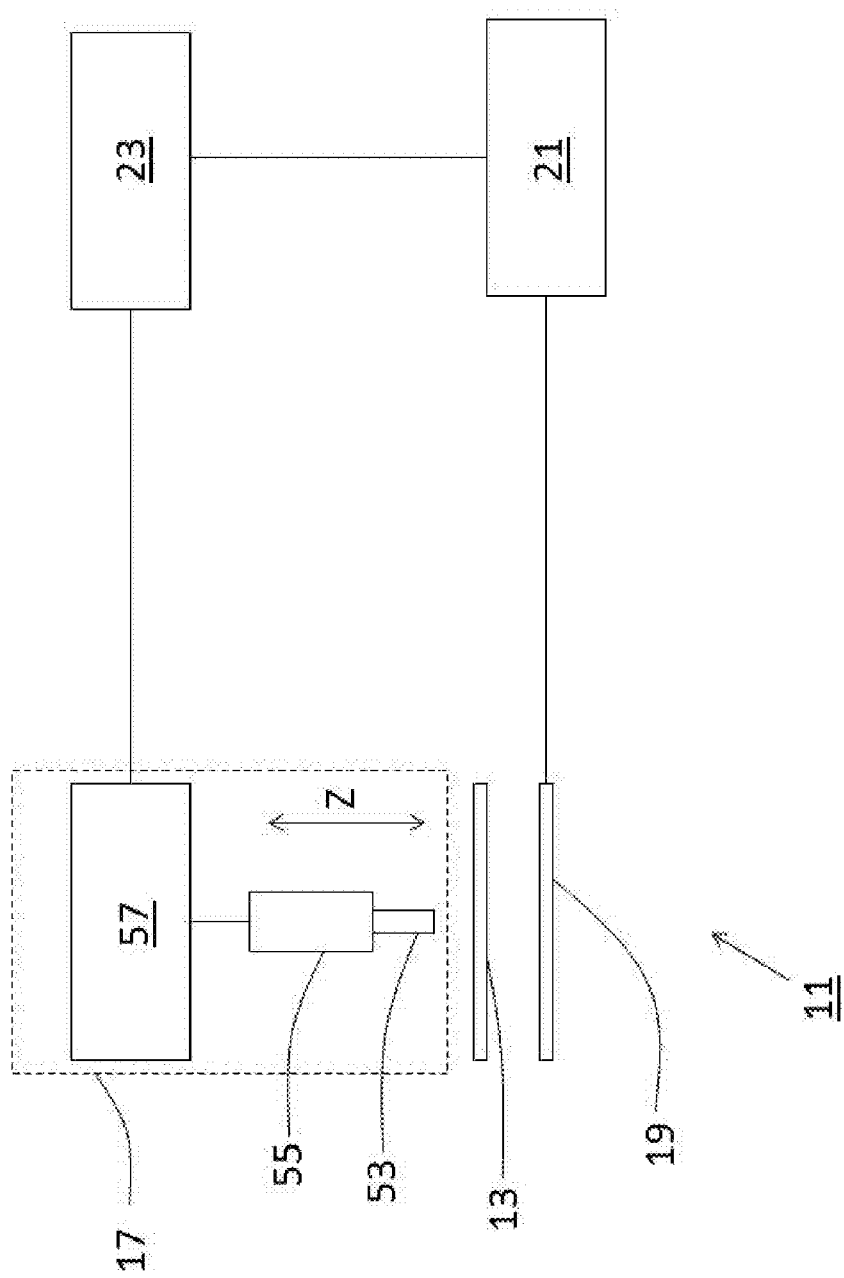
FIG. 1 is simplified schematic representation of a system for detecting the depth of an antenna in the card body of a smart card, the system being constructed according to the teachings of the present invention.

Referring now to FIG. 1, there is shown a system for detecting the depth of an antenna in the card body of a smart card, the system being constructed according to the teachings of the present invention and identified generally by reference numeral 11. As will be explained further in detail below, system 11 utilizes the natural resonance of the card body to accurately determine antenna depth.

In the description that follows, system 11 is shown in use with a card body 13 with an embedded antenna 15. As defined herein, card body 13 represents any item that includes an embedded antenna 15, such as the card body for contactless and dual-interface smart cards.

Antenna detection system 11 comprises a milling device 17 for penetrating one surface of card body 13, a test device 19 disposed in close proximity to card body 13, a network analyzer 21 for measuring a linear characteristic of test device 19, and a control device 23 for regulating operation of milling device 17 in view of the linear characteristic measured by network analyzer 21.

As will be described further below, the natural resonance of antenna 15 influences the linear characteristic of test device 19 that is measured by network analyzer 21. In particular, the instance that milling device 17 contacts antenna 15 creates a measurable variance in the linear characteristic of test device 19 that is then used by control device 23 to limit further penetration of milling device 17 into card body 13. In this manner, the depth of antenna 15 in card body 13 can be precisely determined and, in turn, used to accurately mill an IC module cavity into card body 13 to the surface of antenna 15, which is a principal object of the present invention.

Figure 2:
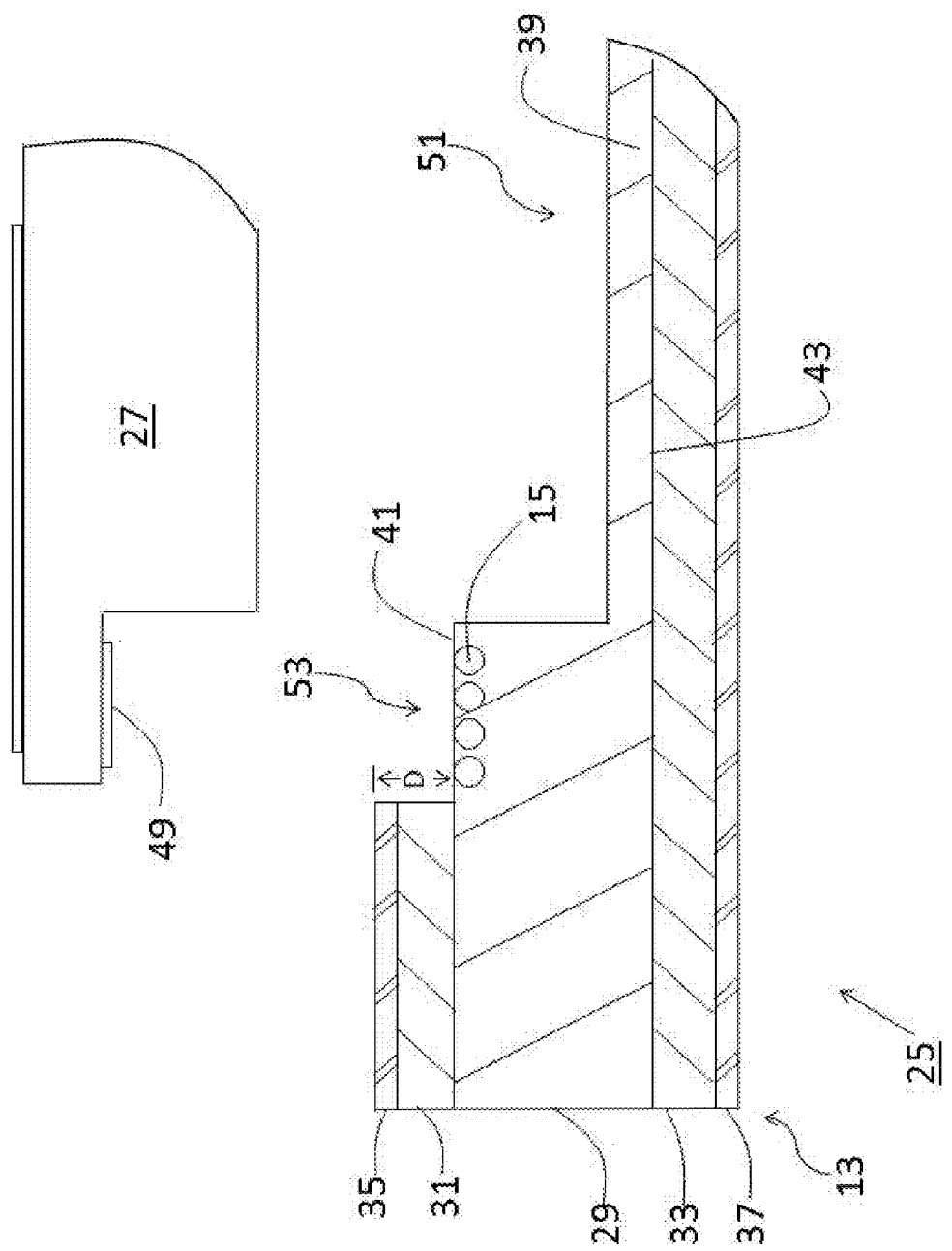
FIG. 2 is an enlarged, partially exploded, fragmentary view of an illustrative smart card constructed using the card body shown in FIG. 1, the card body being shown in section to enhance understanding of certain features of the present invention.

As referenced above, card body 13 represents any item that includes an embedded antenna. For example, referring now to FIG. 2, there is shown an exploded, partial section view of a smart card 25 that includes card body 13, the details of smart card 25 being provided, as needed, for illustrative purposes to facilitate understanding of the operation of system 11.

As can be seen, smart card 25 comprises a card body 13 and an IC module 27. The inclusion of IC module 27 provides card 25 with electronic identification, authentication, data storage and application processing capabilities.

Card body 13 is preferably constructed by laminating together multiple enlarged sheets of durable plastic material, such as polyvinyl chloride (PVC), acrylonitrile butadiene styrene (ABS), or polycarbonate. The resultant laminated product is then punched, stamped, or otherwise cut to form a plurality of card bodies 13 with the requisite dimensions.

Card body 13 comprises a radio frequency (RF) inlay 29 that is disposed between a top plastic layer 31 and a bottom plastic layer 33, each of layers 31 and 33 preferably being printed to provide card body 13 with the proper aesthetic components. In addition, a pair of opposing, transparent, plastic overlays 35 and 37 is disposed on the top and bottom surfaces, respectively, of the stack. As noted above, inlay 29 and layers 31, 33, 35 and 37 are then permanently joined together by any suitable means, such as through a lamination process, to yield unitary card body 13.

As previously referenced, the particular construction of card body 13 is provided herein solely for illustrative purposes. It is to be understood that card body 13 could include an alternative number and arrangement of layers without departing from the spirit of the present invention.

RF inlay 29 includes a core layer, or substrate, 39 that includes a substantially flat top surface 41 and a substantially flat bottom surface 43. Radio frequency (RF) antenna 15 is permanently incorporated into core layer 39.

In the present example, antenna 15 is represented as a conductive wire that is embedded into top surface 41 of core layer 39 about its periphery in a generally coiled or spiraled configuration. The free ends of antenna 15 are preferably densely arranged to form a pair of appropriately configured contact terminals 47, with only one contact terminal being shown herein for ease of illustration.

As can be appreciated, antenna 15 is electrically coupled to contact pads 49 on IC module 27 to provide smart card 25 with RF transmission capabilities. In order to directly connect antenna 15 to contact pads 49, a cavity 51 is milled into the otherwise planar card body 13. As can be seen, cavity 51 is dimensioned to receive IC module 27, with the periphery of cavity 51 shaped to define a narrow shelf, or mounting surface, 53 that supports IC module 27.

Preferably, the peripheral portion of cavity 51 is formed at a depth D that lies in the plane defined by the top surface of the individual windings that form antenna 15. In this manner, the portion of antenna 15 that forms contact terminals 47 is rendered externally exposed for direct connection with IC module 27 without any damage being imparted thereto.

Referring back to FIG. 1, system 11 includes a milling device 17 for forming cavity 51 in card body 13. Milling device 17 comprises a milling bit 53 that is rotably driven by a motor 55. Additionally, a numerical control 57 regulates the principal operation of milling device 17 (e.g. activation of motor 55). Specifically, numerical control 57 enables milling bit 53 to be displaced relative to card body 13 in multiple dimensions, most notably, in the Z direction (as represented by arrow Z in FIG. 1) such that milling bit 53 penetrates into the top surface of card body 13. As a feature of the invention, numerical control 57 enables cavity 51 to be milled in card body 13 with great precision.

Test device 19, also referred to herein as device under test (DUT) 19, represents any electrical component. In the present embodiment, test device 19 is preferably in the form of a simple wire antenna (e.g. a one-turn copper wire antenna) with the same approximate dimensions as antenna 15. DUT 19 is preferably positioned in alignment with antenna 15 in close proximity thereto. As will be explained further below, the natural resonance of antenna 15 influences certain measurable characteristics of test device 19 and, as such, can be used to determine the depth of antenna 15 in card body 13.

Network analyzer 21 is electrically connected to RF test device 19 (e.g. using a two port, subminiature version A (SMA) connector) and is capable of measuring a linear characteristic thereof (e.g. magnitude and phase parameters). Together, test device 19 and network analyzer 21 define an electrical network (i.e. a pair of interconnected electrical components). Measurable parameters associated with the network can be utilized to measure the depth of antenna 15 in card body 13 with great accuracy, as will be explained below.

Specifically, network analyzer 21 generates a test signal (e.g. an RF signal which is swept or stepped to extend across a defined range of frequencies) that is, in turn, applied to DUT 19. Based on properties of test device 19, any mismatch in impedance between the two RF components as well as the frequency range of the test signal, a portion of the test signal that is generated by network analyzer 21 may be reflected by test device 19 back to network analyzer 21 (the remainder of the test signal being transmitted by DUT 19). By measuring this degree of signal reflection, network analyzer 21 is able to quantify a linear characteristic of test device 19.

Preferably, network analyzer 21 is in the form of a vector network analyzer (VNA), such as 8.5 GHz vector network analyzer sold by National Instruments Corporation of Austin, Tex. under model number NI PXIe-5632. As such, network analyzer 21 is capable of measuring network scattering parameters, or S parameters, of the electrical network defined by DUT 19 and network analyzer 21 that, in turn, can be used to measure the depth of antenna 15 in card body 13. Because a vector network analyzer is inherently an instrument with a high level of accuracy, a considerable degree of precision can be realized in milling cavity 51 to the proper antenna depth in card body 13, which is highly desirable.

In use, network analyzer 21 is capable of measuring (i) the magnitude and phase of the incident, or test, signal generated by network analyzer 21, (ii) the magnitude and phase of the portion of the incident signal transmitted by DUT 19 (i.e. the transmitted signal), and (iii) the magnitude and phase of the portion of the incident signal reflected by DUT 19 back to network analyzer 21 (i.e. the reflected signal). As such, network analyzer 21 is capable of representing the forward return loss, or reflection coefficient, for the electrical network as a complex vector quantity with both magnitude and phase by calculating the ratio of the reflected signal relative to the incident signal. Because loss is represented as a ratio of the two signals, there are no restrictions relating to the particular value of the incident source power, since any offset in the incident signal is reflected in the DUT response and is therefore cancelled out when the ratio of the incident and reflected signals is calculated.

Control device 23 is electrically connected to both numerical control 57 of milling device 17 and network analyzer 21. Control device 23 is preferably in the form of any programmable compute device. As will be explained further in detail below, control device 23 is preferably programmed to evaluate network data compiled by network analyzer 21 and, in view of thereof, control the principal operations of milling device 17 in creating IC cavity 51 in card body 13.

Method of Detecting Antenna Depth

System 11 can be used in the following manner to accurately detect the proper depth of antenna 15 in card body 13. As will be described in detail below, the resonance of antenna 15 influences the scattering parameters of the network defined by test device 19 and network analyzer 21. In addition, the resonant frequency of antenna 15 changes upon contact with conductive milling bit 53. Accordingly, by monitoring the network data compiled by network analyzer 21, control device 23 can precisely detect the instant when milling bit 53 contacts antenna 15 and, in response thereto, prevent any further penetration of milling device 17 into card body 13 that could potentially damage antenna 15.

Figure 3A:
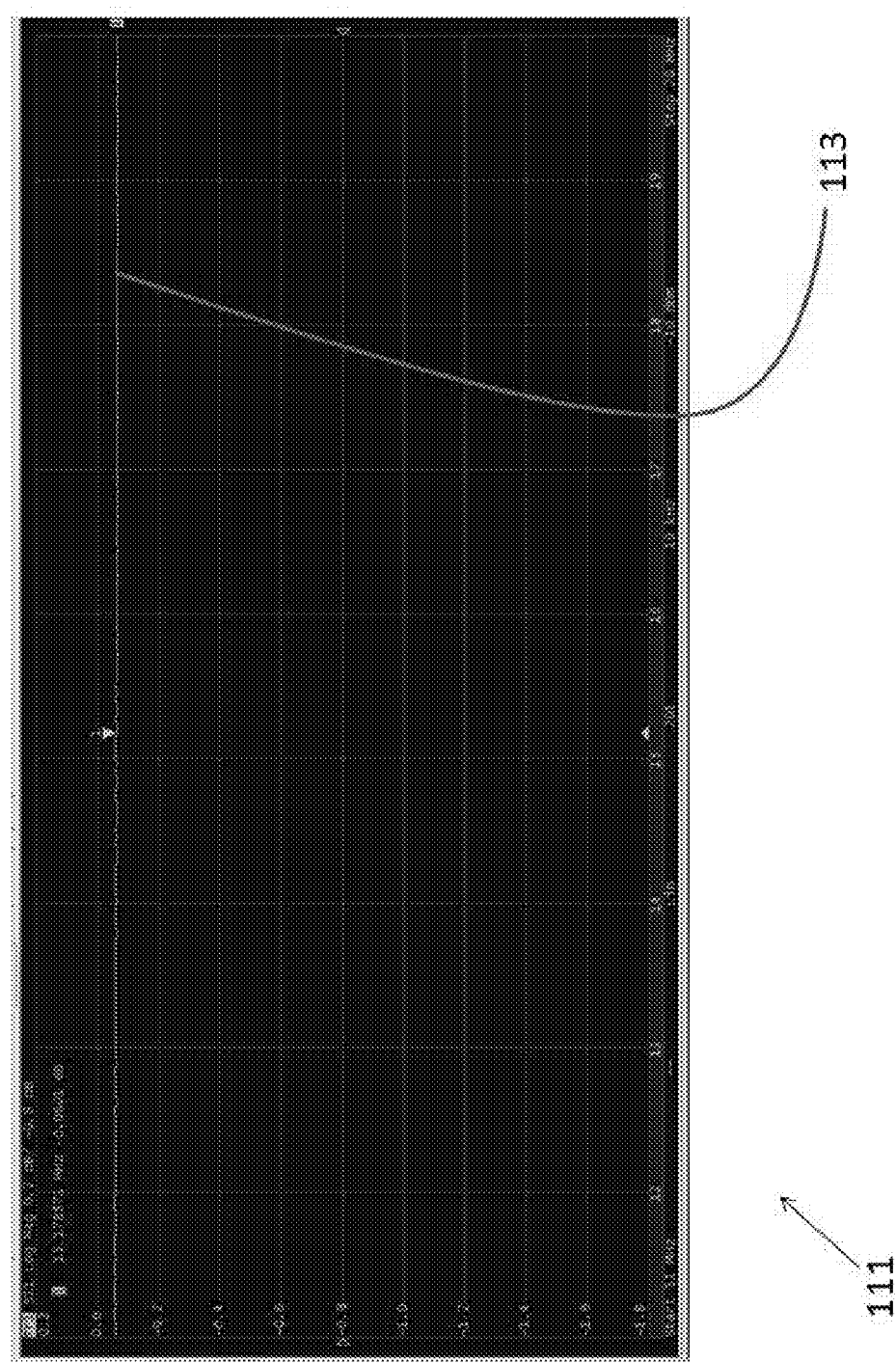
Figure 3B:
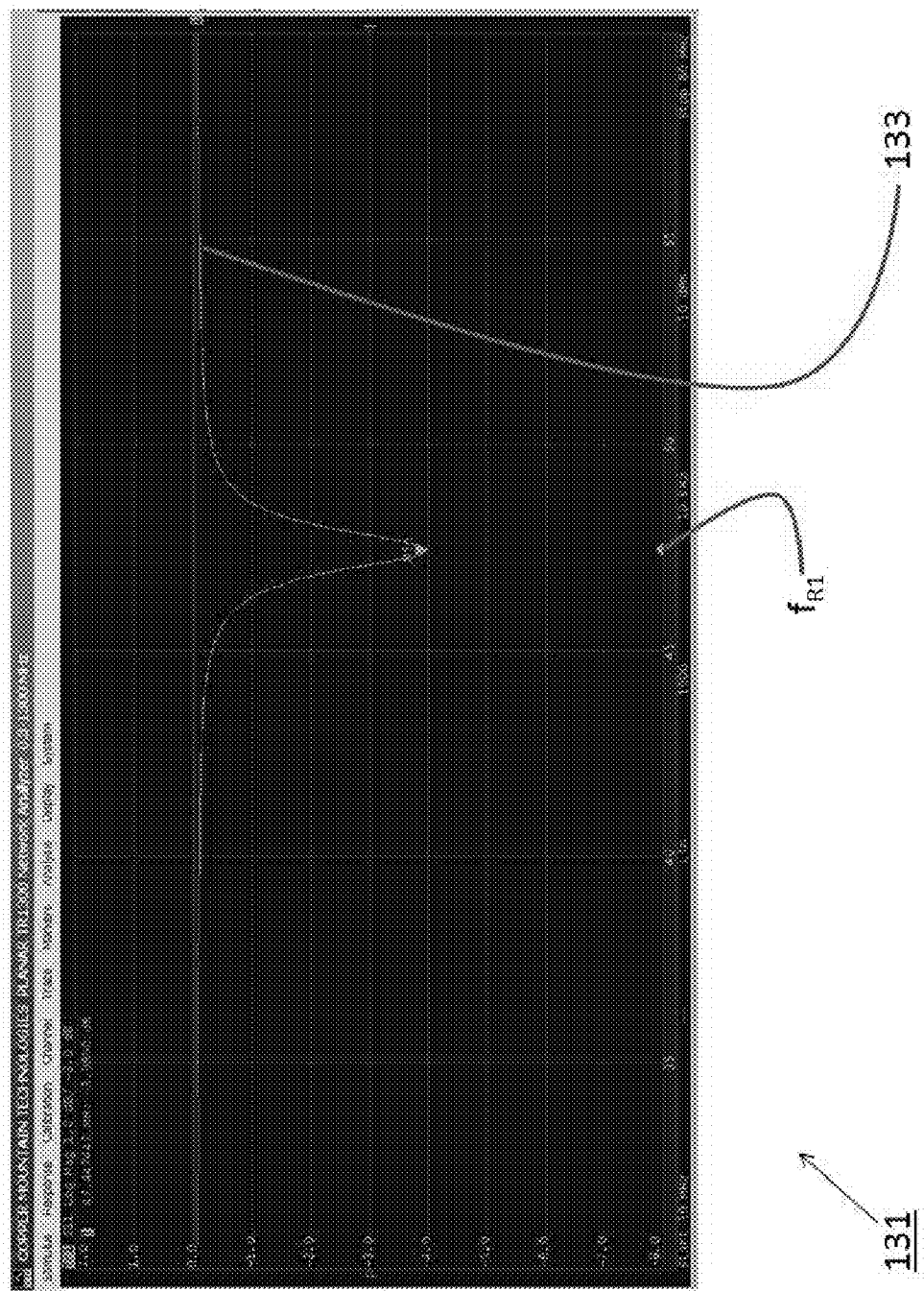

Referring now to FIGS. 3(a)-(c), there is shown a series of graphical representations of actual forward return loss data compiled by network analyzer 21 that is useful in understanding the basic principles of the present invention. In particular, the series of graphical representations illustrates the influence of antenna 15 on certain measurable characteristics of DUT 19.

In FIG. 3(a), there is shown a graphical representation of the forward return loss that is measured by network analyzer 21 in the absence of card body 13 (i.e. with card body 13 removed from the immediate environment of DUT 19), the graph being represented generally by reference numeral 111. As can be seen, graph 111 depicts the forward return loss (in dB) for test device 19 in relation to the multi-frequency incident signal (in MHz).

In the present example, test device 19 is in the form of a bended copper wire antenna with the same basic footprint as antenna 15. Due to the specific properties of test device 19, the multi-frequency incident signal generated by network analyzer 21 is almost fully reflected by DUT 19. As a result, the measured forward return loss 113 in graph 111 extends across the entire frequency band of the incident signal at a constant value of nearly 0 db.

As can be appreciated, antenna 15 in card body 13 has a very precise resonant frequency (i.e. a frequency at which an applied signal coincides with the natural response frequency of the open antenna circuit). For antenna 15 (as well as the embedded antennae found in most conventional smart cards), the resonant frequency typically falls within the frequency range of approximately 40-50 MHz, the precise value of the resonant frequency being dependent upon, inter alia, the diameter, pitch, and number of turns of the antenna wire.

It is important to note that antenna 15 is a resonant circuit upon its initial construction. In other words, antenna 15 exhibits resonance with a very precise frequency even as an open circuit (i.e. prior to IC module 27 being connected thereto).

The aforementioned resonance of antenna 15 influences the forward return loss of test device 19. Specifically, in FIG. 3(b), there is shown a graphical representation of the forward return loss that is measured by network analyzer 21 in the presence of card body 13 (i.e. with card body 13 disposed in close proximity to DUT 19), the graph being represented generally by reference numeral 131.

As can be seen, the value of the measured forward return loss 133 remains near 0 db throughout the majority of the frequency band, which indicates that the incident signal generated by network analyzer 21 is almost fully reflected by DUT 19 at these frequencies. However, as the incident signal approaches the natural resonant frequency $f_{R1}$ of antenna 15 (approximately 47 MHz), forward return loss 133 increases substantially to −3.9 dB.

The aforementioned condition is the result of energy from the incident test signal (i.e. generated by network analyzer 21 for DUT 19) being directly absorbed by antenna 15 as the incident signal approaches the natural resonant frequency $f_{R1}$ of antenna 15. As a result of energy being absorbed by antenna 15, a corresponding decrease in the amount of energy reflected by DUT 19 is measured by network analyzer 21, which results in the measured increase in forward return loss 133.

As referenced briefly above, direct contact made by conductive milling bit 53 against antenna 15 instantly modifies the frequency at which antenna 15 exhibits resonance. This modification in the resonance of antenna 15, in turn, modifies the forward return loss measured by network analyzer 21. As a result, because network analyzer 21 is a very precise and accurate instrument, any variance in forward return loss that exceeds a predefined threshold can be used to indicate that the proper depth of antenna 15 in card body 13 has been reached, and thereby limit any further penetration of milling device 17 into card body 13 that could otherwise damage antenna 15.

Specifically, in FIG. 3(c), there is shown a graphical representation of the forward return loss that is measured by network analyzer 21 in the presence of card body 13 at the precise instant that conductive milling bit 53 contacts a single contact terminal 47 of antenna 15, the graph being represented generally by reference numeral 151. As can be appreciated, antenna 15 exhibits a lower resonant frequency $f_{R2}$ (approximately 43 MHz) at the instant milling bit 53 is drawn into contact with one contact terminal 47 of antenna 15. In response, forward return loss 153 in graph 151 experiences a corresponding shift in relation to forward return loss 133 in graph 131.

Specifically, forward return loss 153 exhibits a notable increase in value, or spike, at the modified resonant frequency $f_{R2}$ for antenna (approximately 43 MHz), since antenna 15 has been reconditioned to absorb energy at the modified resonant frequency $f_{R2}$ (approximately 43 MHz) rather than the original resonant frequency $f_{R1}$ (approximately 47 MHz). It should also be noted that the amount of reflected energy at resonant frequency $f_{R2}$ in graph 151 decreases to approximately −1.7 dB from its previous, undisturbed value of −3.9 dB. As can be appreciated, the conductivity of milling bit 53, motor 55 and the remainder of device 17 changes the properties of the resonance circuit inside card body 13 in such a manner so as to reduce the amount of energy absorbed by antenna 15 of the incident signal.

In the example referenced above, milling bit 53 contacts a single contact terminal 47 of antenna 15 which causes in a change in the properties of the resonant circuit inside card body 13. It should be noted that if milling bit 53 contacts both contact terminals 47 simultaneously (e.g. if a larger diameter milling bit 53 is utilized), the resonant circuit in card body 13 will experience a different change in its properties.

Specifically, if milling bit 53 simultaneously contacts both contact terminals 47, a short condition will be created that closes the normally open resonant circuit. This closing of the resonant circuit shifts the resonance of antenna 15 outside of the observed frequency band of the incident signal. Accordingly, in this scenario, antenna 15 would have no influence on DUT 19 in the measured frequency band (i.e. will absorb no energy from the incident signal), thereby resulting in a measured forward return loss graph that is similar to graph 111 in FIG. 3(*a*).

Figure 4:
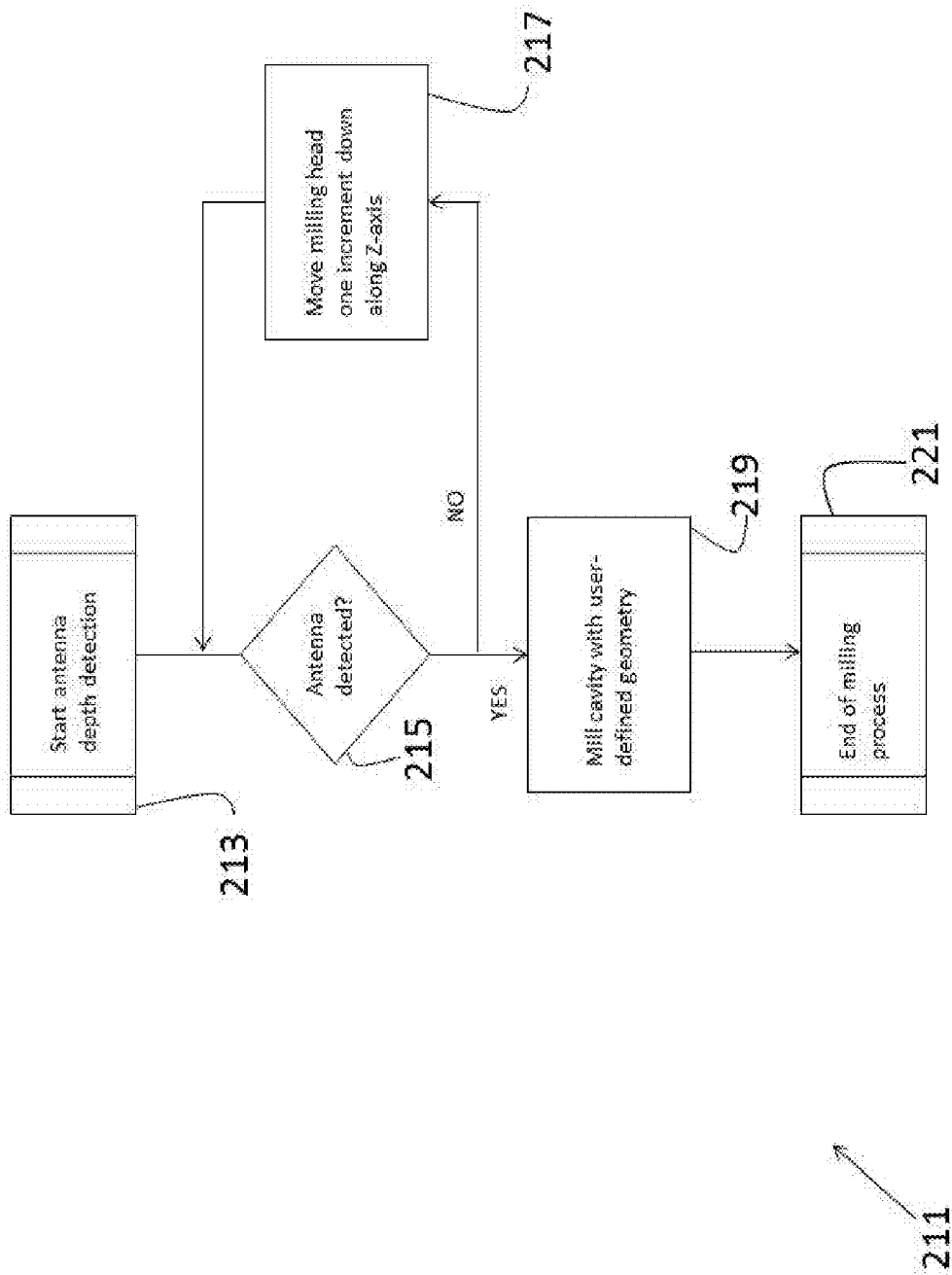
FIG. 4 is a simplified flow chart depicting a computer-implementable method for milling an IC module cavity in a card body to the proper antenna depth.

As can be appreciated, the contact of milling bit 53 against either a single contact terminal 47 (as represented by graph 153 in FIG. 3(*c*)) or both contact terminals 47 (as represented by graph 111 in FIG. 3(*a*)) instantly causes a notable change in the measured forward return loss. By programming control device 23 to detect such variances in the forward return loss, the depth of antenna 15 in card body 13 can be precisely determined For instance, control device 23 could be implemented with a simple computer program that executes a preferred milling process 211 shown in FIG. 4. Specifically, as the first step of milling process 211, milling bit 53 penetrates into top surface of card body 13 a defined distance, the initial milling step being identified by reference numeral 213. Thereafter, in step 215, control device 23 extracts measured forward return loss data compiled by network analyzer 21 and, in turn, compares the data against a defined forward return loss standard that is representative of card body 13.

If the measured data does not vary relative to the defined standard by a particular threshold, control device 23 determines that antenna 15 has not been detected (i.e. that card body 13 has not been milled to the extent that antenna 15 is externally exposed for direct connection). Accordingly, in step 217, milling bit 53 is advanced one defined step, or increment, further into card body 13 in the Z direction. Upon completion of advanced milling step 217, process 211 returns to data comparison step 215 to determine whether antenna 15 is now exposed.

Once it is determined by control device 23 that antenna 15 is exposed (i.e. the variance in forward return loss measured by network analyzer 21 exceeds a defined threshold), milling device 17 is locked in the Z-dimension to prevent any damage to antenna 15. Fixed in the Z-dimension, milling device 17 then carries out the remainder of the milling process in card body 13 to the desired geometry in step 219 (e.g. by displacing milling device 17 within the fixed plane). Once the proper geometry has been milled into card body 13 at the appropriate depth, milling process 211 ends, as shown in step 221.

As a feature of the present invention, the aforementioned process for detecting the depth of antenna 15 can be accomplished with great accuracy and minimal complexity while, at the same time, taking into account tolerances in the thickness of card body 13, which are principal objects of the present invention.

The embodiments shown above are intended to be merely exemplary and those skilled in the art shall be able to make numerous variations and modifications to it without departing from the spirit of the present invention. All such variations and modifications are intended to be within the scope of the present invention as defined in the appended claims.

What is claimed is:

1. A system for detecting the depth of an antenna embedded in a card body, the antenna having a resonant frequency, the system comprising:
   (a) a milling device for forming a cavity in the card body, the milling device being adapted to penetrate into the card body through a series of incremental stages, the milling device comprising,
       (i) a milling bit adapted to selectively penetrate the card body;
       (ii) a motor for rotably driving the milling bit; and
       (iii) a numerical control for regulating operation of the motor;
   (b) a test device disposed in relation to the card body, the test device exhibiting a linear characteristic that is selectively influenced by the antenna in the card body;
   (c) a network analyzer for measuring the linear characteristic of the test device at each incremental stage of penetration into the card body; and
   (d) a control device electrically connected to the milling device and the network analyzer, wherein the control device regulates operation of the milling device in view of the linear characteristic measured by the network analyzer.

2. The system as claimed in claim 1 wherein contact of the milling bit against the antenna in the card body changes the resonant frequency for the antenna and thereby modifies the linear characteristic of the test device measured by the network analyzer.

3. The system as claimed in claim 2 wherein the control device limits further penetration of the milling bit into the card body upon detection of a modification in the linear characteristic of the test device measured by the network analyzer that exceeds a predefined threshold.

* * * * *